United States Patent
Qi et al.

(10) Patent No.: US 10,700,173 B2
(45) Date of Patent: Jun. 30, 2020

(54) FINFET DEVICE WITH A WRAP-AROUND SILICIDE SOURCE/DRAIN CONTACT STRUCTURE

(71) Applicant: GLOBALFOUNDRIES Inc., Grand Cayman (KY)

(72) Inventors: Yi Qi, Niskayuna, NY (US); Hsien-Ching Lo, Clifton Park, NY (US); Hong Yu, Rexford, NY (US); Yanping Shen, Saratoga Springs, NY (US); Wei Hong, Clifton Park, NY (US); Xing Zhang, Clifton Park, NY (US); Ruilong Xie, Niskayuna, NY (US); Haiting Wang, Clifton Park, NY (US); Hui Zhan, Clifton Park, NY (US); Yong Jun Shi, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 53 days.

(21) Appl. No.: 15/949,730

(22) Filed: Apr. 10, 2018

(65) Prior Publication Data
US 2019/0312117 A1    Oct. 10, 2019

(51) Int. Cl.
| | | |
|---|---|---|
| *H01L 29/417* | (2006.01) | |
| *H01L 29/78* | (2006.01) | |
| *H01L 29/08* | (2006.01) | |
| *H01L 29/423* | (2006.01) | |
| *H01L 29/45* | (2006.01) | |

(Continued)

(52) U.S. Cl.
CPC .. *H01L 29/41791* (2013.01); *H01L 21/02532* (2013.01); *H01L 21/02614* (2013.01); *H01L 21/02636* (2013.01); *H01L 21/30604* (2013.01); *H01L 29/0847* (2013.01); *H01L 29/42376* (2013.01); *H01L 29/45* (2013.01); *H01L 29/665* (2013.01); *H01L 29/66636* (2013.01); *H01L 29/66795* (2013.01); *H01L 29/7851* (2013.01); *H01L 21/02576* (2013.01); *H01L 21/02579* (2013.01); *H01L 21/31053* (2013.01); *H01L 29/165* (2013.01); *H01L 29/6656* (2013.01);

(Continued)

(58) Field of Classification Search
None
See application file for complete search history.

(56) References Cited

U.S. PATENT DOCUMENTS

| | | | |
|---|---|---|---|
| 7,531,437 | B2 | 5/2009 | Brask et al. |
| 7,534,675 | B2 | 5/2009 | Bangsaruntip et al. |

(Continued)

*Primary Examiner* — Mounir S Amer
(74) *Attorney, Agent, or Firm* — Amerson Law Firm, PLLC

(57) ABSTRACT

One illustrative FinFET device disclosed herein includes a source/drain structure that, when viewed in a cross-section taken through the fin in a direction corresponding to the gate width (GW) direction of the device, comprises a perimeter and a bottom surface. The source/drain structure also has an axial length that extends in a direction corresponding to the gate length (GL) direction of the device. The device also includes a metal silicide material positioned on at least a portion of the perimeter of the source/drain structure for at least a portion of the axial length of the source/drain structure and on at least a portion of the bottom surface of the source/drain structure for at least a portion of the axial length of the source/drain structure.

16 Claims, 15 Drawing Sheets

(51) Int. Cl.
*H01L 21/306* (2006.01)
*H01L 29/66* (2006.01)
*H01L 21/02* (2006.01)
H01L 21/3105 (2006.01)
H01L 29/165 (2006.01)

(52) U.S. Cl.
CPC .... *H01L 29/66545* (2013.01); *H01L 29/7848* (2013.01)

(56) References Cited

U.S. PATENT DOCUMENTS

| | | | |
|---|---|---|---|
| 2011/0147840 A1* | 6/2011 | Cea | H01L 29/41791 257/347 |
| 2012/0007051 A1 | 1/2012 | Bangsaruntip et al. | |
| 2013/0082277 A1* | 4/2013 | Park | H01L 29/41725 257/76 |
| 2013/0207167 A1* | 8/2013 | Cui | H01L 29/78 257/288 |
| 2014/0001520 A1 | 1/2014 | Glass et al. | |
| 2015/0221676 A1* | 8/2015 | Holt | H01L 29/66795 257/347 |
| 2016/0276449 A1* | 9/2016 | Bae | H01L 21/308 |
| 2018/0090583 A1* | 3/2018 | Choi | H01L 29/401 |

\* cited by examiner

Fig. 3
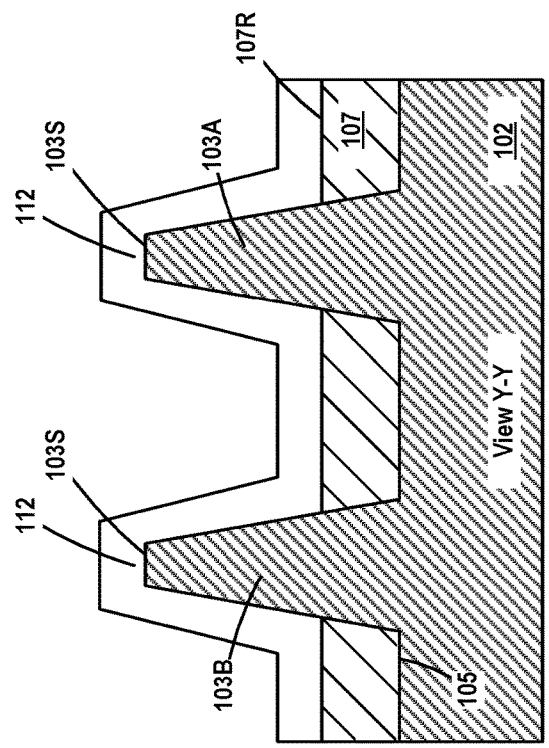
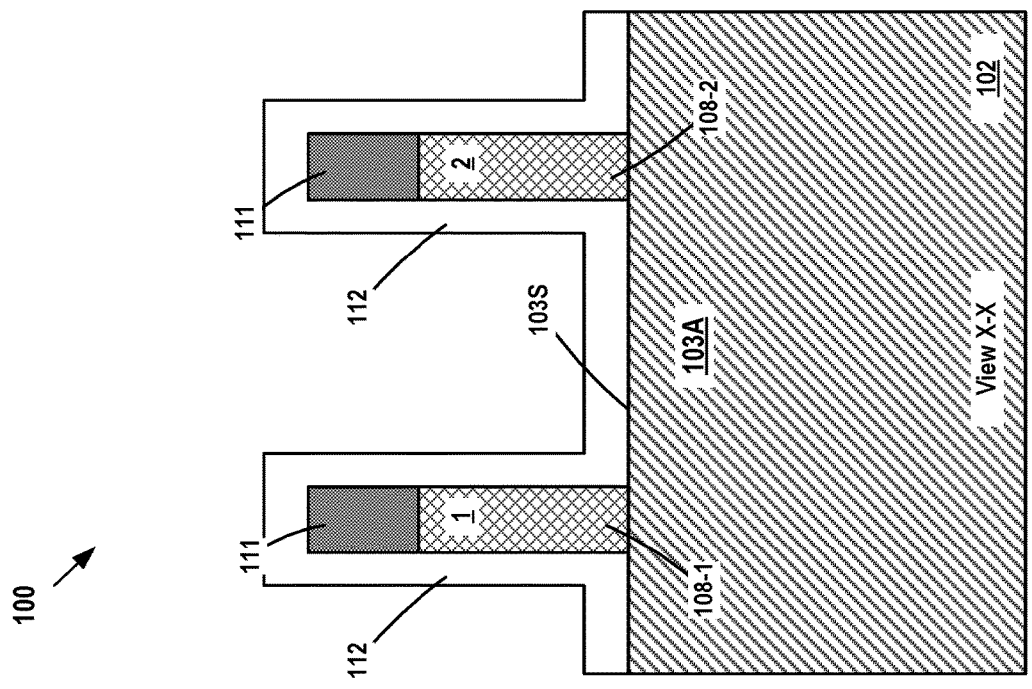

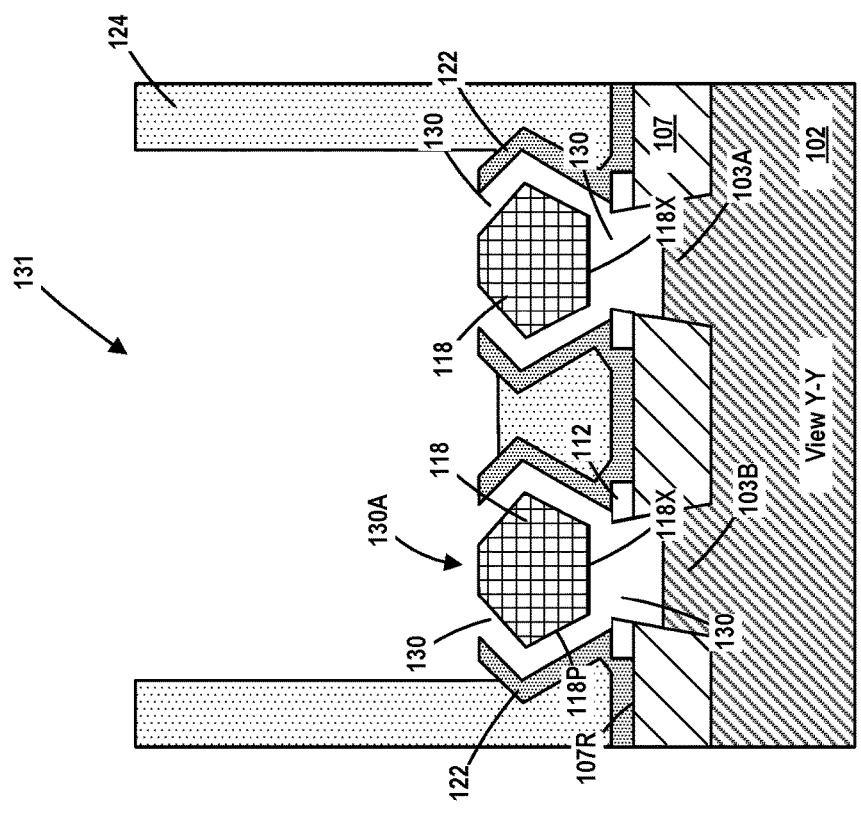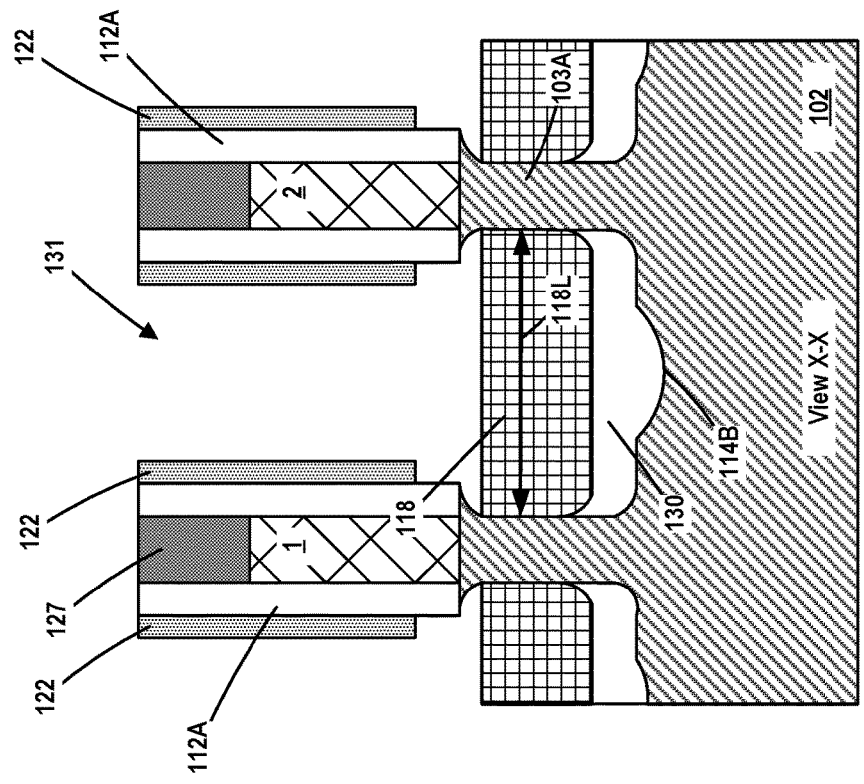
Fig. 11

Fig. 12
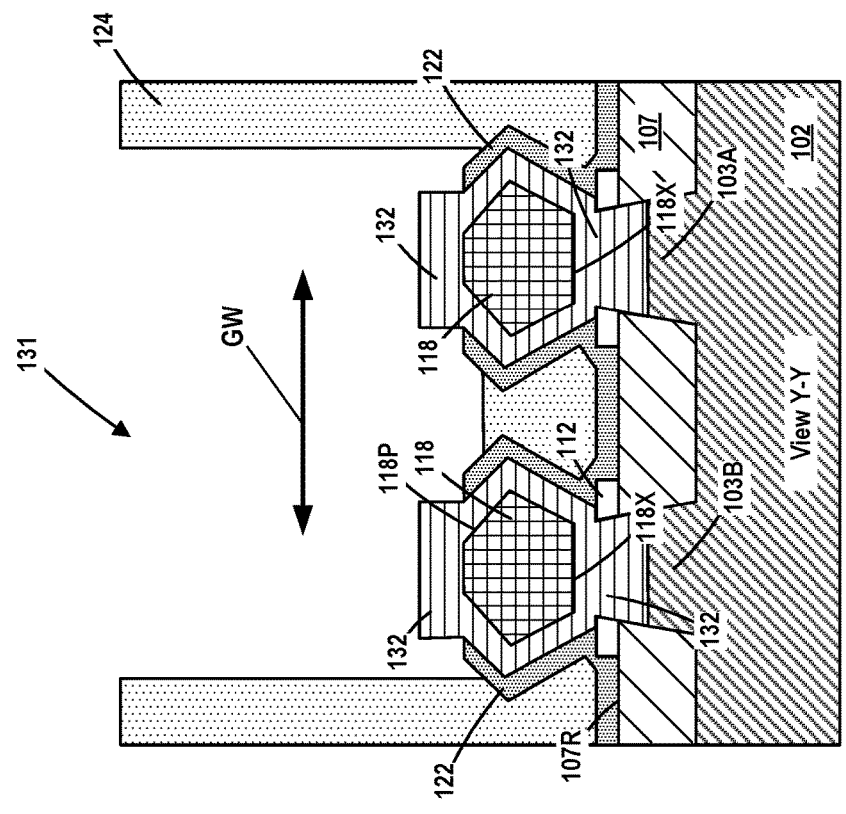
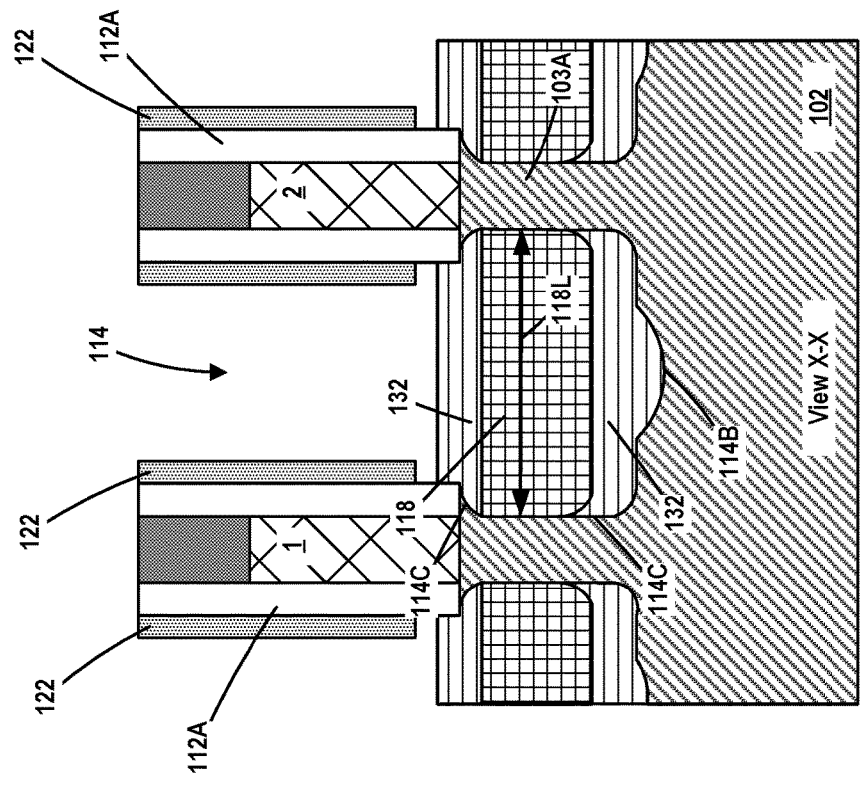

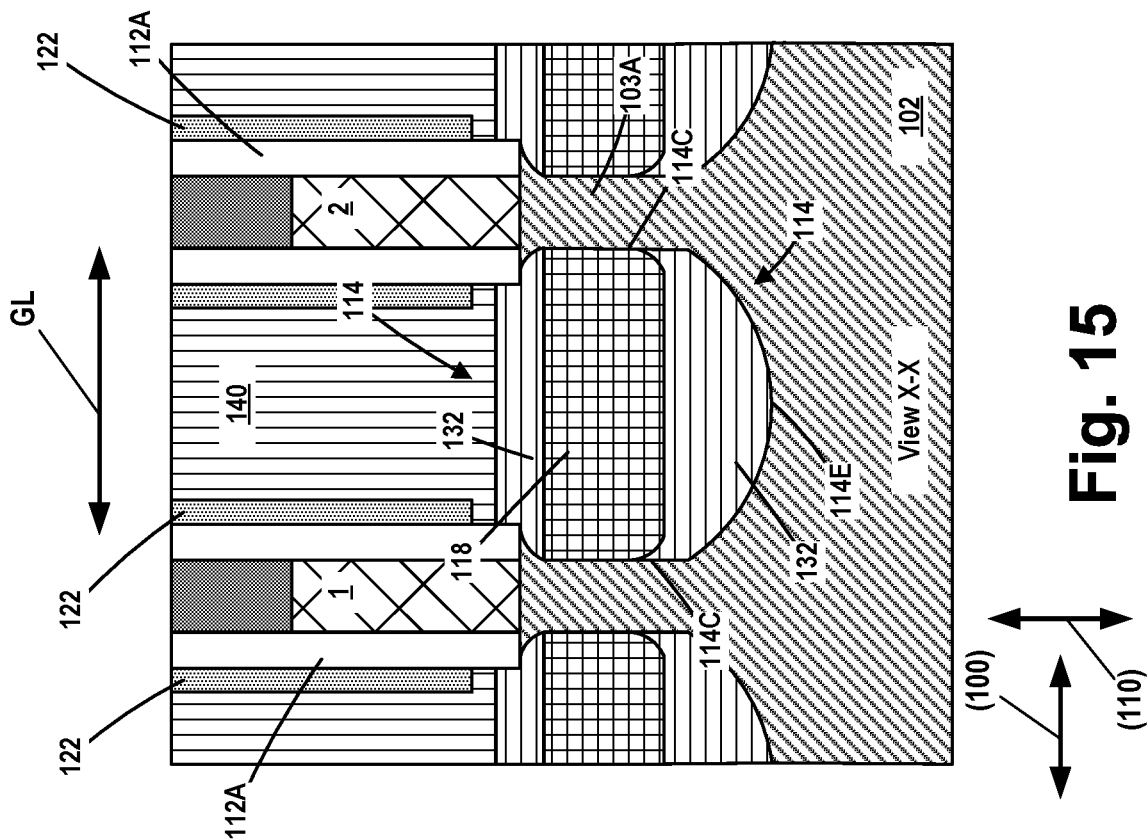
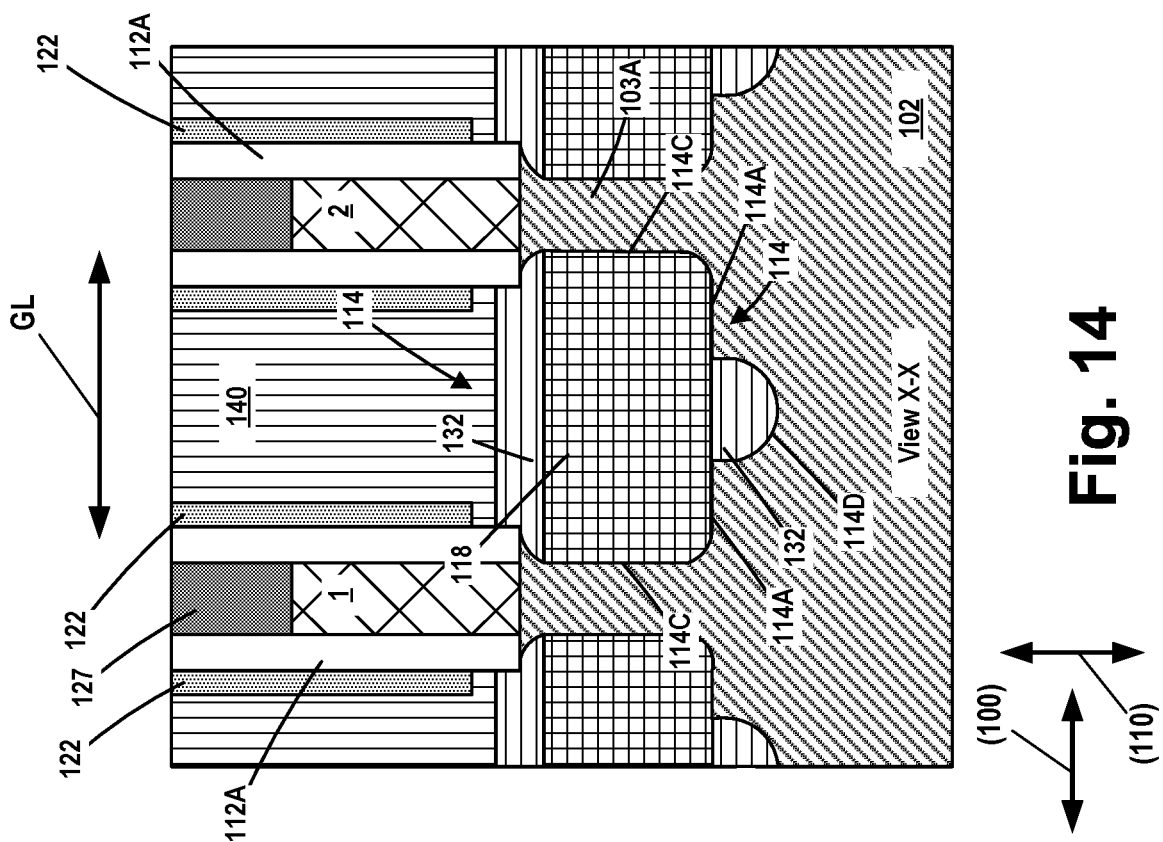

FINFET DEVICE WITH A WRAP-AROUND SILICIDE SOURCE/DRAIN CONTACT STRUCTURE

BACKGROUND OF THE INVENTION

1. Field of the Invention

The present disclosure generally relates to the fabrication of integrated circuits, and, more particularly, to various embodiments of a FinFET device with a wrap-around silicide source/drain contact structure and methods of making such a FinFET device.

2. Description of the Related Art

A conventional field effect transistor (FET) is a planar device wherein the entire channel region of the device is formed parallel and slightly below the planar upper surface of a semiconducting substrate. In contrast to a planar FET, there are so-called 3D devices, such as an illustrative FinFET device, which is a three-dimensional structure. FIG. 1 is a perspective view of an illustrative prior art FinFET device 10 that is formed above a semiconductor substrate 12 wherein the fins 14 (e.g., features) of the device 10 are made of the material of the substrate 12, e.g., silicon. The device 10 includes a plurality of fin-formation trenches 13, three illustrative fins 14, a gate structure 16, a sidewall spacer 18 and a gate cap 20. An insulating material 17, e.g., silicon dioxide, provides electrical isolation between the fins 14. The gate structure 16 is typically comprised of a layer of insulating material (not separately shown), e.g., a layer of high-k insulating material (k value of at least 10 or greater), and one or more conductive material layers that serve as the gate electrode for the device 10. The gate structure 16 may be manufactured using well-known gate-first or replacement gate manufacturing techniques. The fins 14 have a three dimensional configuration: a height H, a width W and an axial length L. The axial length L of the fins 14 extends in the gate length direction of the FinFET device 10, i.e., the direction of current travel in the device 10 when it is operational. The gate width direction of the device 10 is orthogonal to the gate length direction. The portions of the fins 14 that are covered by the gate structure 16 are the channel regions of the FinFET device 10. The portions of the features or fins 14 that are positioned outside of the spacers 18 will become part of the source/drain regions of the device 10.

After the gate structure 16 (sacrificial or final), the gate cap 20 and the spacer 18 are formed, an epitaxial growth process will be formed to form epitaxial semiconductor material (shown in dashed lines on only one of the fins 14) on the portions of each of the fins 14 in the source/drain regions of the device 10. At some point thereafter, a metal silicide material (not shown) will be formed on the epi semiconductor material in the source/drain regions of the device 10 to reduce the contact resistance between a conductive contact (that will be formed) and the source/drain regions of the device. In some cases, the metal silicide material may only be formed on essentially the top or upper surface portions 14A of the fin. In other cases, the metal silicide material may be formed on the upper surface portion 14A and both of the side surface portions 14B of the epi semiconductor material. Further reductions in the contact resistance between the source/drain contact structures and the source/drain regions of a FinFET device is desirable so as to improve device performance.

The present application is generally directed to various embodiments of a FinFET device with a wrap-around silicide source/drain contact structure and methods of making such a FinFET device that may solve or at least reduce one or more of the problems identified above.

SUMMARY OF THE EMBODIMENTS

The following presents a simplified summary of various embodiments of the subject matter disclosed herein in order to provide a basic understanding of some aspects of the technology disclosed herein. This summary is not an exhaustive overview of the technology disclosed herein. It is not intended to identify key or critical elements of the technology disclosed herein or to delineate the scope of the subject matter disclosed herein. Its sole purpose is to present some concepts in a simplified form as a prelude to the more detailed description that is discussed later.

Generally, the present disclosure is directed to various embodiments of a FinFET device with a wrap-around silicide source/drain contact structure and methods of making such a FinFET device. In one illustrative example, a FinFET device with a gate width direction and a gate length direction is disclosed herein. The device includes a source/drain structure that, when viewed in a cross-section taken through the source/drain structure in a direction corresponding to the gate width direction, comprises a perimeter and a bottom surface, the source/drain structure also comprising an axial length that extends in a direction corresponding to the gate length direction. The device also includes a metal silicide material positioned on at least a portion of the perimeter of the source/drain structure for at least a portion of the axial length of the source/drain structure and on at least a portion of the bottom surface of the source/drain structure for at least a portion of the axial length of the source/drain structure.

BRIEF DESCRIPTION OF THE DRAWINGS

The disclosure may be understood by reference to the following description taken in conjunction with the accompanying drawings, in which like reference numerals identify like elements, and in which:

FIGS. 2-16 depict various embodiments of a FinFET device with a wrap-around silicide source/drain contact structure and methods of making such a FinFET device.

Figure 1:
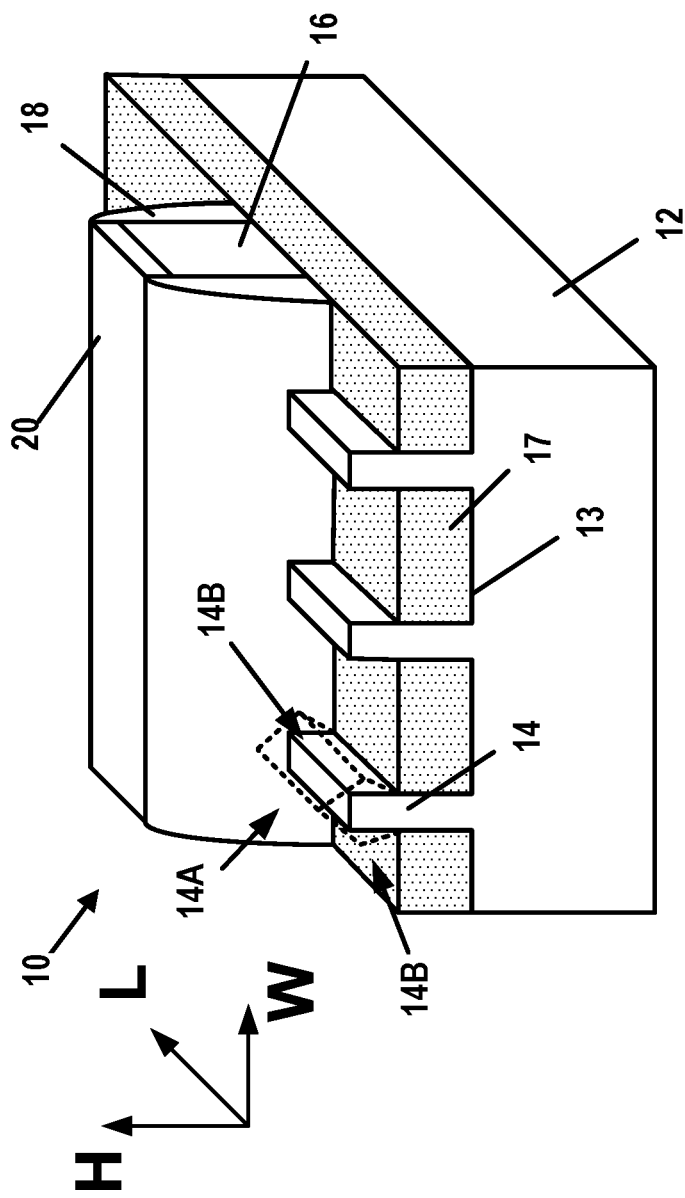
FIG. 1 is a simplistic depiction of an illustrative prior art FinFET device.

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various embodiments of a FinFET device with a wrap-around silicide source/drain contact structure and methods of making such a FinFET device. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. In the examples depicted herein, the gate structures for the transistor devices will be depicted as being formed using "replacement gate" manufacturing techniques, but such gate structures may also be manufactured using gate-first manufacturing techniques. Of course, the illustrative embodiments of the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 2:
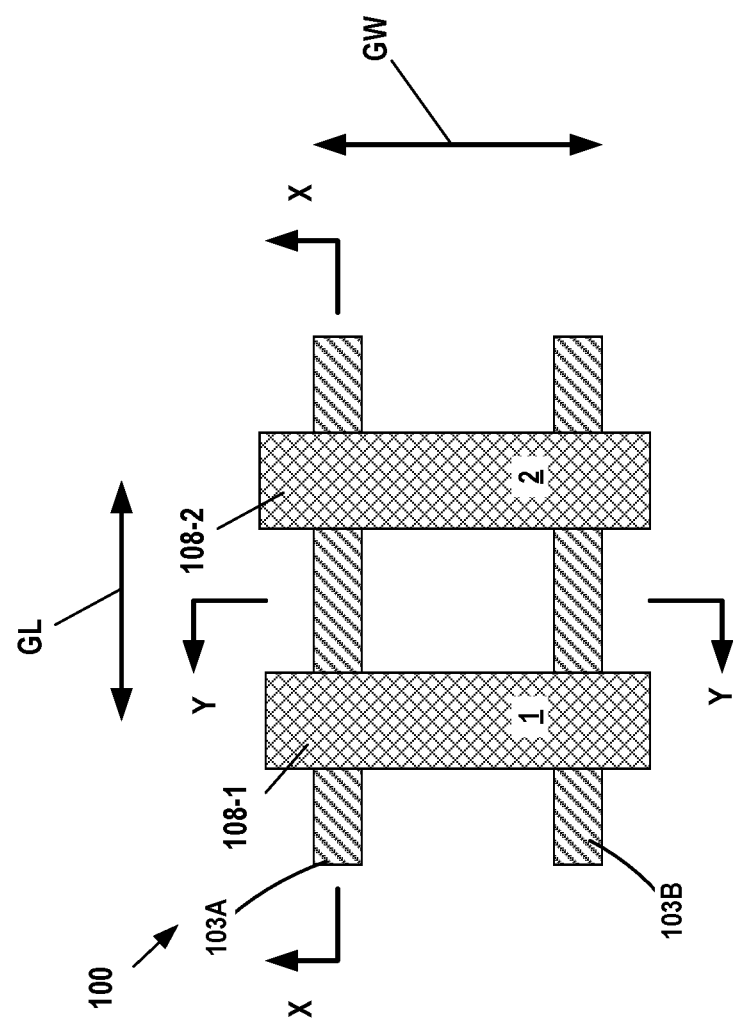

FIGS. 2-16 depict various embodiments of a FinFET device with a wrap-around metal silicide source/drain contact structure and methods of making such a FinFET device on an IC product 100. FIG. 2 is a simplistic plan view of one illustrative embodiment of an IC product 100 that may be formed using the methods described herein. The product 100 comprises a plurality of substrate fins 103A, 103B (collectively referenced using the numeral 103) and a plurality of gate structures 108-1, 108-2 (collectively referenced using the numeral 108). The gate structures 108 have also been labeled as gates 1 and 2 for reference purposes. Various cross-sectional views of the product 100 (views "X-X" and "Y-Y") depicted herein are taken where indicated in FIG. 2.

More specifically, the view X-X is a cross-sectional view taken through the substrate fin 103A and the gate structures 108 in a gate length (GL) direction of the transistor devices, while the view Y-Y is a cross-sectional view taken through the substrate fins 103 in a gate width (GW) direction of the devices.

The product 100 will be formed on a semiconductor substrate 102. The substrate 102 may have a variety of configurations, such as the depicted bulk silicon configuration. The substrate 102 may also have a semiconductor-on-insulator (SOI) configuration that includes a bulk semiconductor layer, a buried insulation layer and an active semiconductor layer positioned on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconductor materials and all forms of such materials. Additionally, various doped regions, e.g., halo implant regions, well regions and the like, are not depicted in the attached drawings.

FIG. 3 depicts the IC product 100 after several process operations were performed. First, the substrate fins 103 were formed by performing one or more etching processes, e.g., anisotropic etching processes, through a patterned fin-formation etch mask (not shown) to form a plurality of fin-formation trenches 105 in the substrate 102 and thereby form the plurality of substrate fins 103. The substrate fins 103 have an upper surface 103S. The width and height of the substrate fins 103 may vary depending upon the particular application. Additionally, the overall size, shape and configuration of the fin-formation trenches and substrate fins 103 may vary depending on the particular application. Next, a recessed layer of insulating material 107 (e.g., silicon dioxide) with a recessed upper surface 107R was formed between the substrate fins 103 by performing traditional manufacturing techniques.

Still with reference to FIG. 3, after the layer of insulating material 107 was recessed, the gates structures 108 and gate caps 111 were formed above the substrate fins 103. In the example shown herein, the gate structures 108 are sacrificial gate structures. Next a conformal deposition process was performed to form a conformal layer of spacer material 112 on the product 100. The layer of spacer material 112 may be made from a variety of different materials, e.g., silicon nitride, and its thickness may vary depending upon the particular application.

Figure 4:
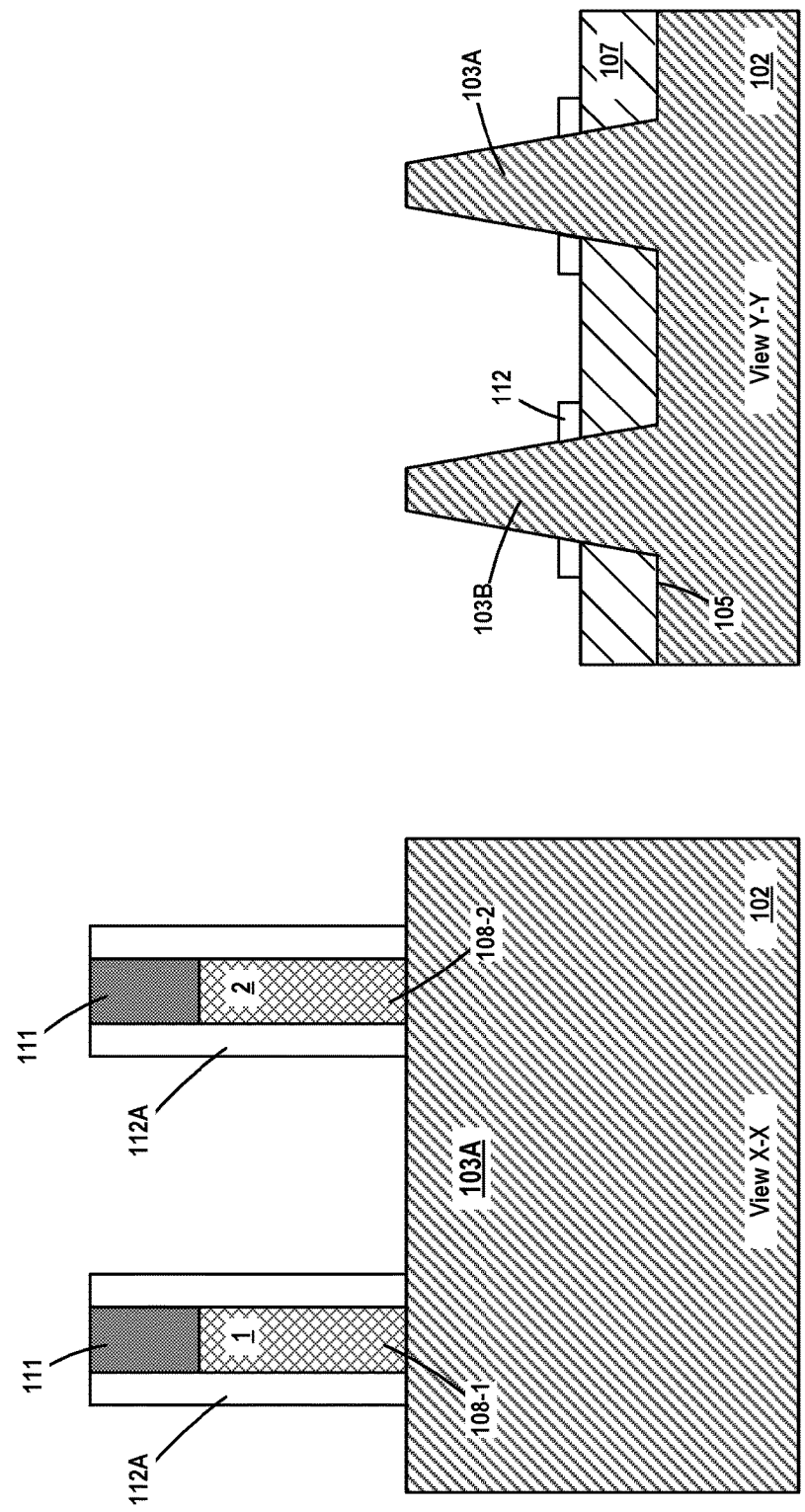

FIG. 4 depicts the product 100 after an anisotropic etching process was performed on the layer of spacer material to form simplistically depicted spacers 112A adjacent the gate structures 108. As reflected in the view Y-Y, during this etching process, substantially all of the layer of spacer material 112 is removed from the portions of the substrate fins 103 that are not covered by the gate structures 108 and the sidewall spacers 112A, i.e., the portions of the substrate fins 103 in the source/drain regions of the FinFET devices will be essentially cleared of the layer of spacer material 112.

Figure 5:
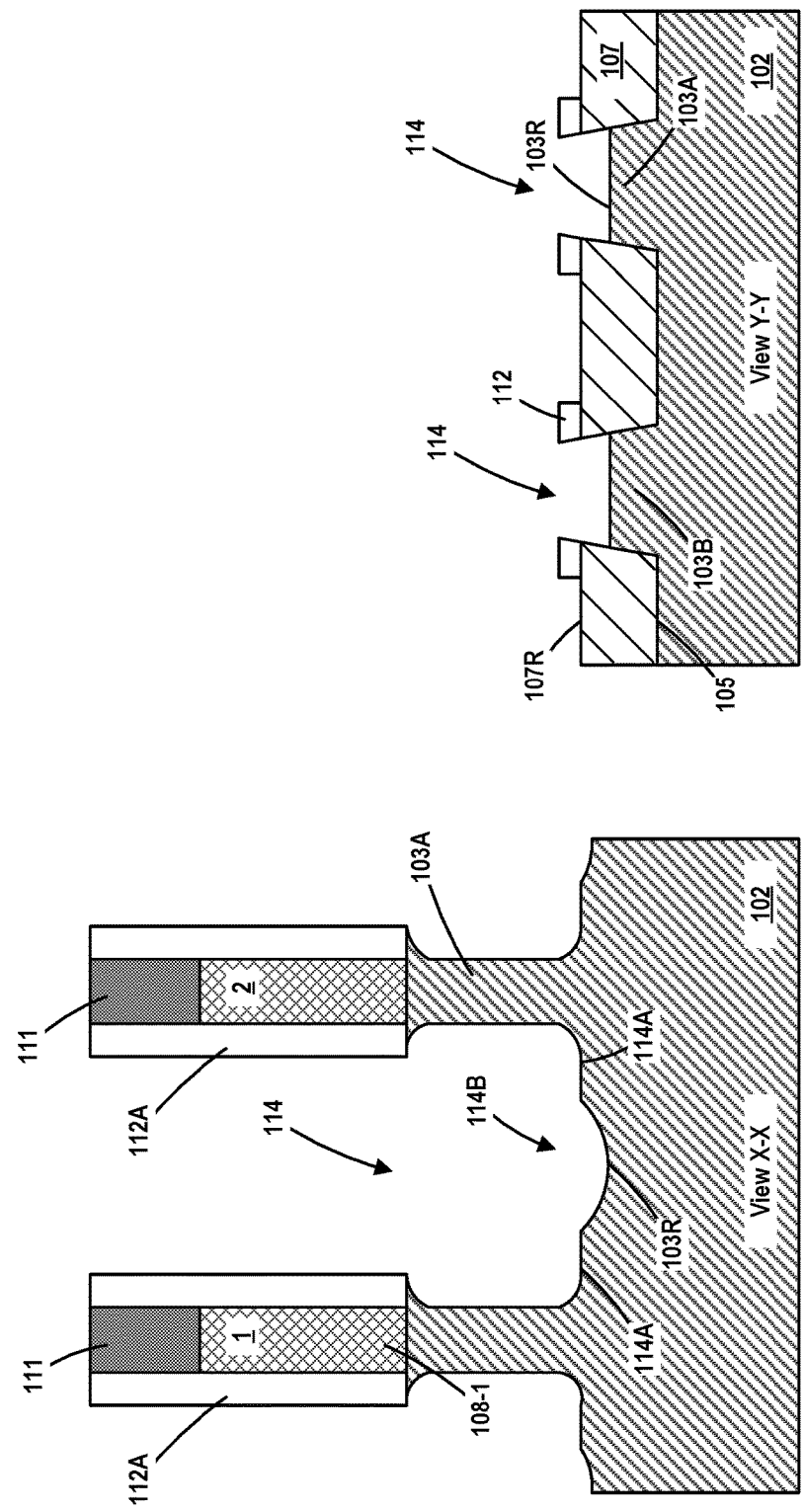

FIG. 5 depicts the product 100 after an etching process was performed to remove a vertical portion of the parts of the original substrate fins 103 positioned in the source/drain regions of the devices. This results in the formation of a plurality of source/drain cavities 114 in the original substrate fins 103. As described more fully below, the source/drain cavities 114 may be specifically formed with certain shapes so as to enhance the formation of a sacrificial epi semiconductor material in the source/drain cavities 114. In one illustrative example, the etching process may be a combination of anisotropic and isotropic etching processes such that the resulting source/drain cavities 114 extend laterally under the spacers 112A to at least some degree. In the example shown in FIG. 5, the formation of the source/drain cavities 114 only involves removal of a portion of the vertical height of the substrate fins 103 as the lowermost surface 103R of the source/drain cavities 114 is positioned above the bottom of the fin formation trenches 105 and below the recessed upper surface 107R of the layer of insulating material 107. In the example shown in FIG. 5, the bottom surface of the source/drain cavities 114 comprises a substantially planar surface 114A with a dished recess 114B (with a cross-sectional configuration of a partial elliptical shape (when viewed in the cross section shown in the view X-X) formed therein. In one illustrative example, the depth of the recess 114B may be about 1-5 nm below the planar surface 114A.

Figure 6:
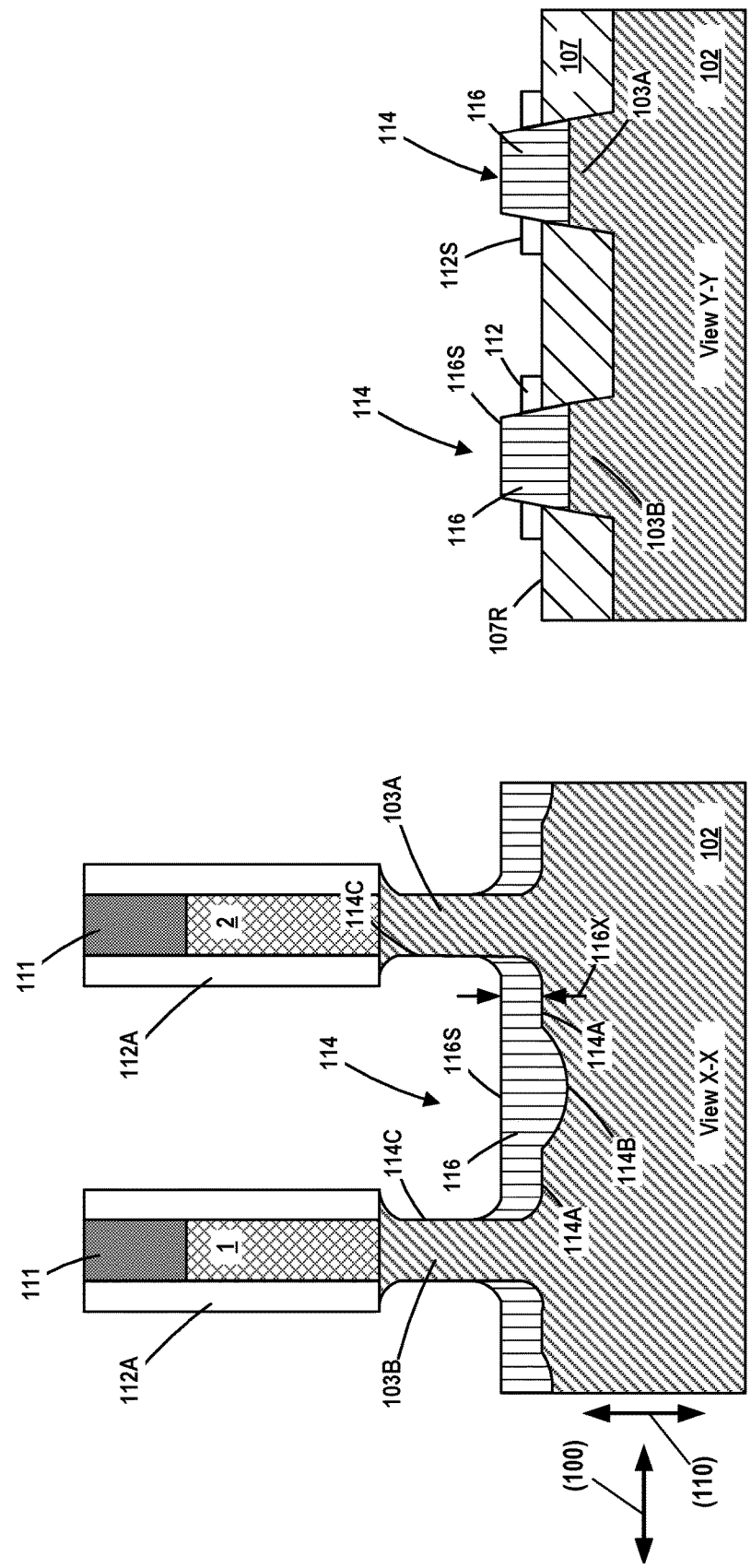

FIG. 6 depicts the product 100 after a sacrificial epi semiconductor material 116 (with an upper surface 116S) was formed in the source/drain cavities 114 by performing an epitaxial growth process. Note that the sacrificial epi semiconductor material 116 only partially fills the source/drain cavities 114. The epi material 116 may be formed to any desired thickness 116X. In one illustrative example, the thickness 116X of the sacrificial epi semiconductor material 116 may be about 1-5 nm. The sacrificial epi semiconductor material 116 should be made of a material that may be selectively etched relative to the material of the substrate 102 and additional semiconductor material 118 (see FIG. 7) that will be formed on the sacrificial epi semiconductor material 116, as described more fully below. In the illustrative example where the substrate 102 is silicon, the sacrificial epi semiconductor material 116 may be made of a material such as, for example, germanium or silicon germanium (e.g., $Si_{0.15}Ge_{0.85}$). The sacrificial epi semiconductor material 116 may be undoped or doped. During the formation of the sacrificial epi semiconductor material 116, the epi deposition process is controlled such that the sacrificial epi semiconductor material 116 is formed substantially entirely in the bottom region of the source/drain cavities 114 with little or no sacrificial epi semiconductor material 116 being formed on the sidewalls 114C of the source/drain cavities 114 above the upper surface 116S of the sacrificial epi semiconductor material 116. The selective formation of the sacrificial epi semiconductor material 116 in the bottom of the source/drain cavities 114 may be accomplished using a variety of techniques, including performing multiple deposition/etching processes and/or using a high order precursor (e.g., $S_2H_6$, $GeH_6$), etc. As shown in the view Y-Y, to the extent any of the layer of spacer material 112 remains in the source/drain regions, the sacrificial epi semiconductor material 116 may be formed to a thickness such that the upper surface 116S of the sacrificial epi semiconductor material 116 is positioned at a level that is above the upper surface 112S of any residual spacer material 112.

Figure 7:
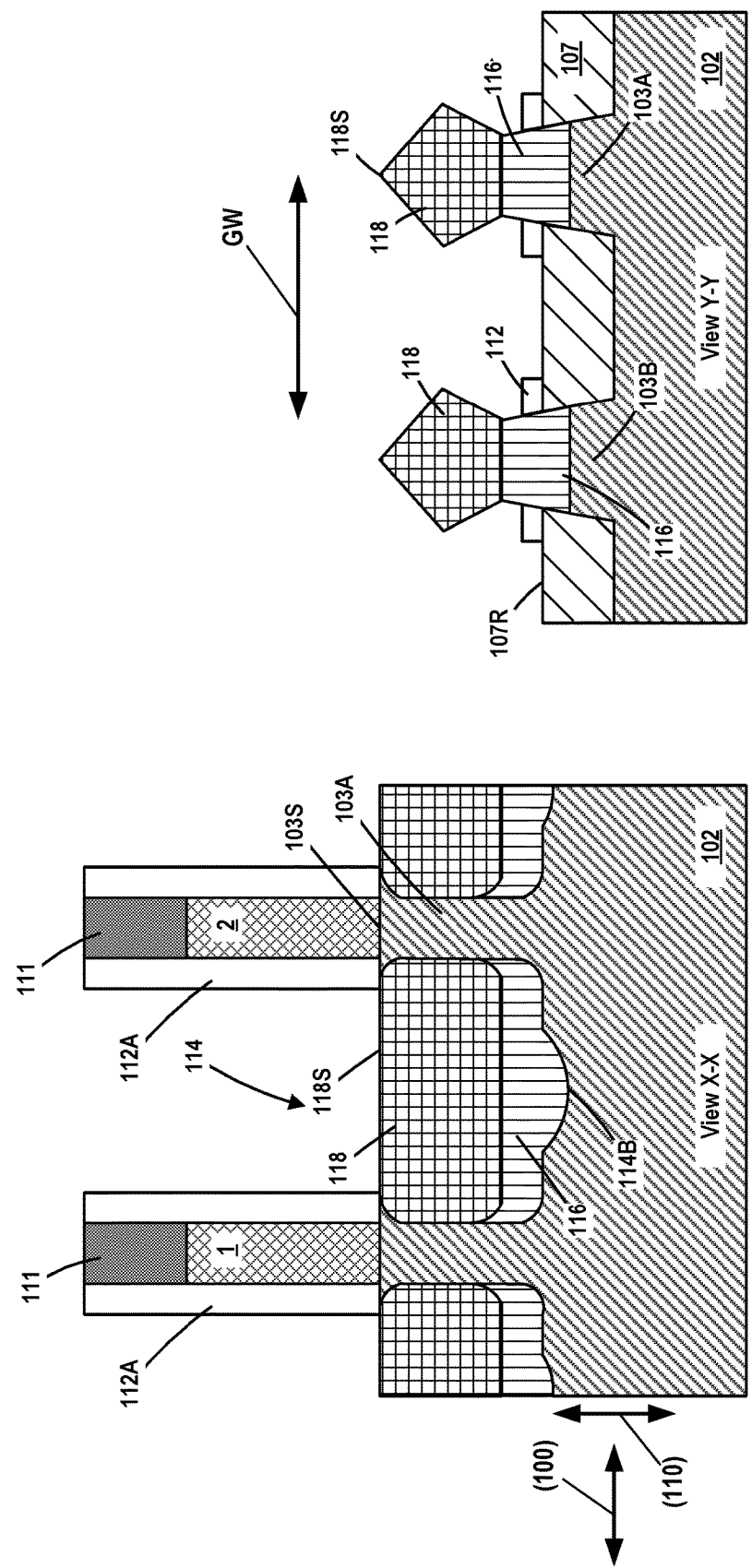

FIG. 7 depicts the product 100 after another epi deposition process was performed to form a source/drain structure 118 in each of the source/drain cavities 114 on the sacrificial epi semiconductor material 116. The source/drain structure 118 may be made of any desired semiconductor material and it may be formed in a doped (in situ doping) or an undoped condition. Due to the crystallographic orientation (see view X-X) of the material of the substrate 102, the source/drain structure 118 has a diamond-like configuration (see view Y-Y) when viewed in a cross-section taken through the source/drain structure 118 in a direction corresponding to the gate width (GW) direction of the devices. The amount of the epi semiconductor material that is formed when making the source/drain structure 118 may vary depending upon the particular application. In the illustrative example depicted herein, a sufficient amount of the epi semiconductor material is formed such that the uppermost surface 118S of the source/drain structure 118 is substantially planar with the upper surface 103S of the portions of the initial substrate fins 103 that remain positioned under the gate structures 108. Of course, if desired, the source/drain structure 118 may be formed such that its uppermost surface 118S is positioned above or below the upper surface 103S of the substrate fins 103. As noted above, the source/drain structure 118 may be comprised of a variety of different materials depending upon the type of devices under construction. For example, for P-type devices, the source/drain structure 118 may be an in-situ P-doped (e.g., boron) silicon germanium material. In the situation where the devices are N-type devices, the source/drain structure 118 may be an in-situ N-doped (e.g., phosphorus) silicon material.

Figure 8:
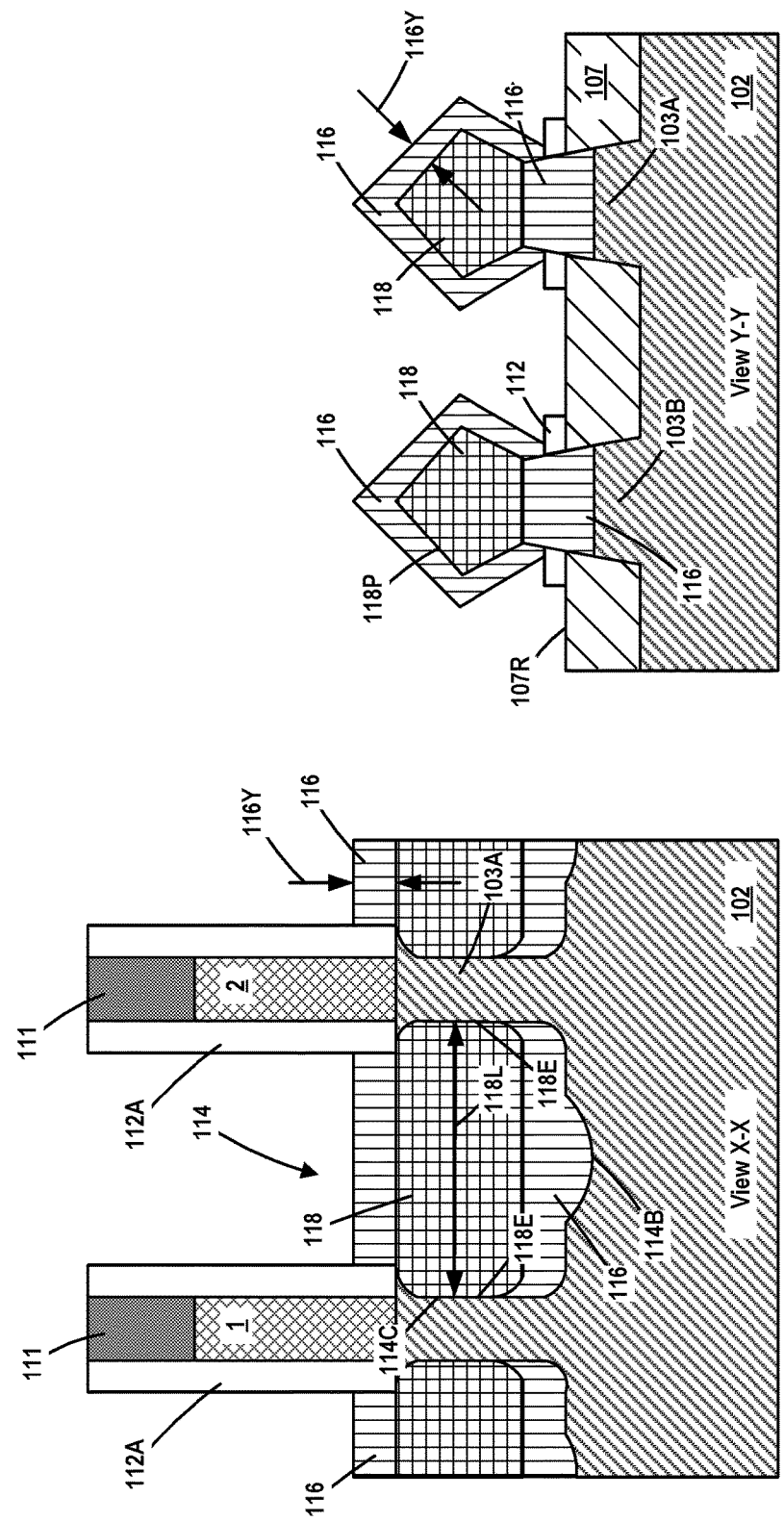

FIG. 8 depicts the product 100 after another epi deposition process was performed to form additional amounts of the sacrificial epi semiconductor material 116 on and around the source/drain structure 118. The additional sacrificial epi semiconductor material 116 may be formed such that it has a desired thickness 116Y around the source/drain structure 118. In one illustrative example, the thickness 116Y may be about 1-5 nm. However, the thickness 116Y may not be entirely uniform around the entire outer perimeter 118P of the source/drain structure 118 and it may not be entirely uniform for the entire axial length 118L of the source/drain structure 118. Importantly, when viewed in a cross-section taken through the source/drain structure 118 in a direction corresponding to the gate width (GW) direction of the devices, the source/drain structure 118 is now surrounded by the sacrificial epi semiconductor material 116 for substantially the entire axial length 118L of the source/drain structure 118. Note that the ends 118E of the source/drain structure 118 abut the sidewalls 114C of the source/drain cavities 114.

Figure 9:
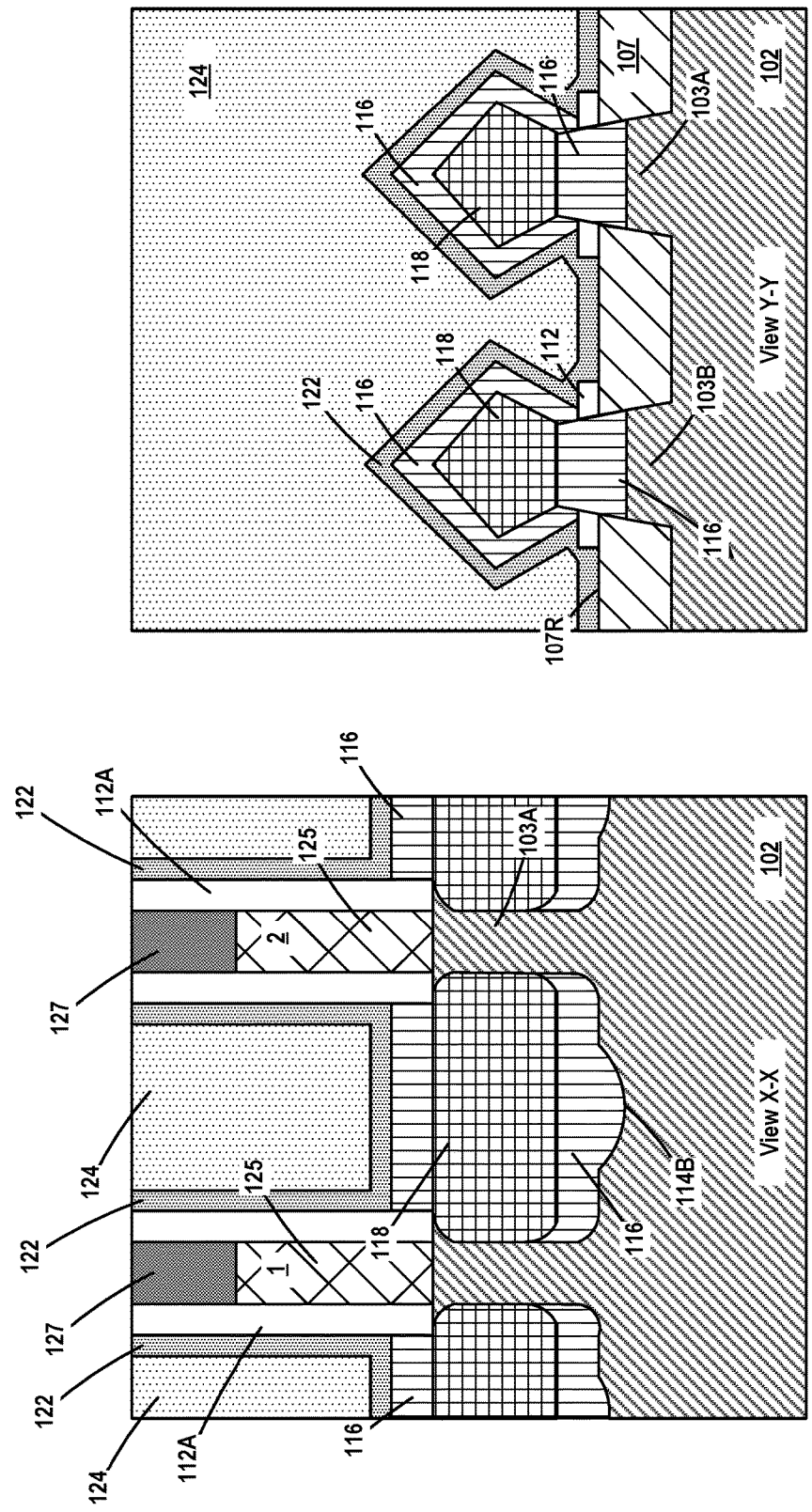

FIG. 9 depicts the IC product 100 after several process operations were performed. First, a conformal deposition process was performed to form a contact etch stop layer 122, e.g., silicon nitride, on the product 100. The conformal etch stop layer 122 may be formed to any desired thickness. Thereafter, a layer of insulating material 124, e.g., silicon dioxide, was formed on the product. At that point, traditional replacement gate manufacturing processes were performed to remove the gate caps 111 and the sacrificial gate structures 108 so as to form replacement gate cavities between the spacers 112A. Thereafter, the materials for the final gate structures 125 were formed in the gate cavities. Such materials for the final gate structures 125 may include a layer of high-k (k value greater than 10) gate insulation material and one or more layers of conductive material that will function as the gate electrode in the final gates structure 125. Then, a recess etching process was performed to recess the materials of the final gate structure 125 to make room for a final gate cap 127. The final gate cap 127 was formed by depositing the material of the final gate cap 127, e.g., silicon nitride, and then performing a CMP process to remove excess amounts of the final gate cap material using the layer of insulation 124 as a polish stop.

Figure 10:
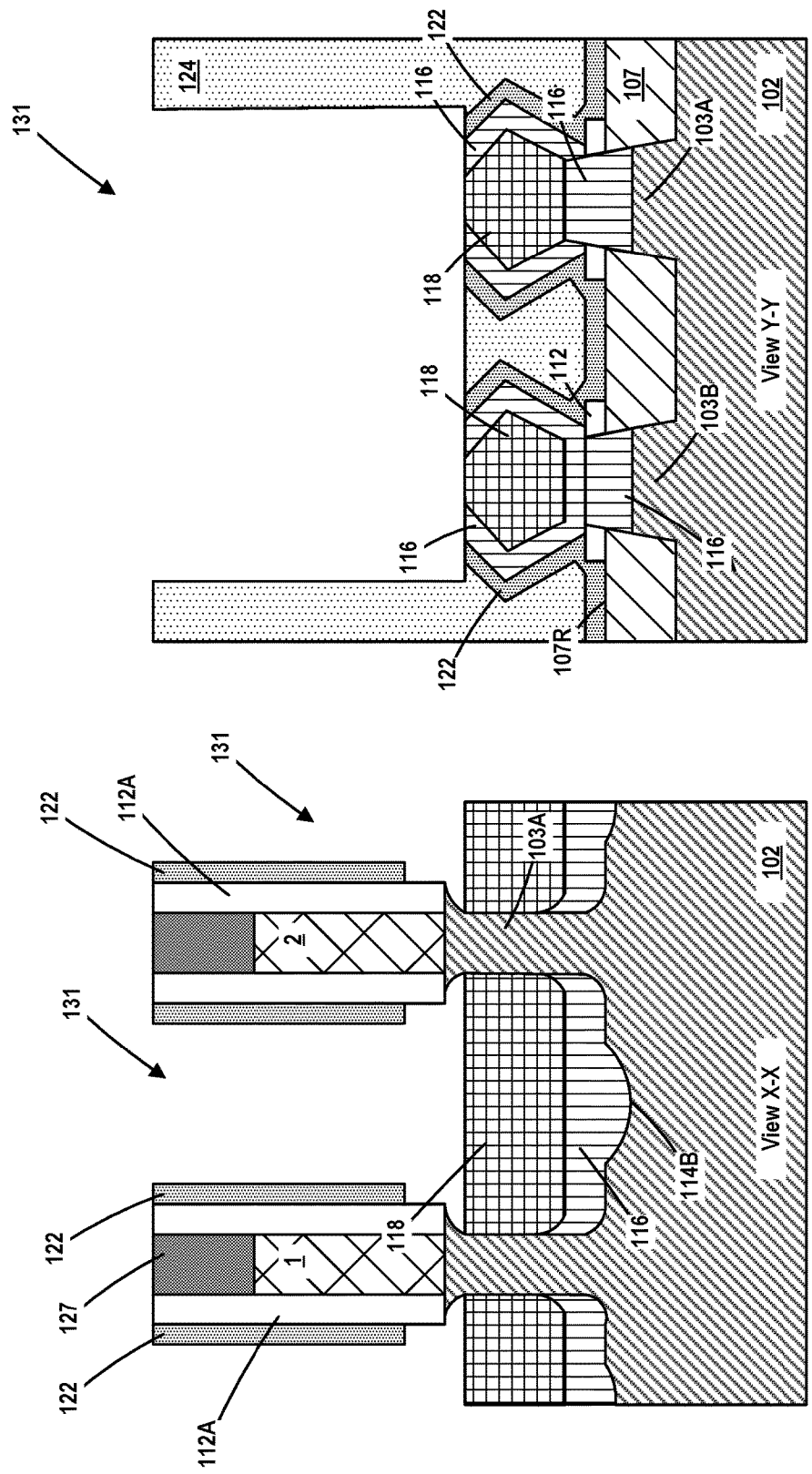

FIG. 10 depicts the product 100 after several process operations were performed. First, an etching process was performed through a patterned etch mask (not shown) to remove portions of the layer of insulating material 124 selectively relative to the surrounding materials. This first etching process stops on the contact etch stop layer 122. Thereafter, another etching process was performed to remove the exposed portions of the contact etch stop layer 122 relative to the surrounding materials and the formation of a source/drain contact opening 131. This second etching process exposes at least the sacrificial epi semiconductor material 116 within the contact opening 131. In this particular example, as shown in the view Y-Y, the etching process to remove the exposed portions of the contact etch stop layer 122 also unintentionally removed portions of the sacrificial epi semiconductor material 116 and the source/drain structure 118. In an ideal situation, removal of the contact etch stop layer 122 would simply expose the sacrificial epi semiconductor material 116 that is positioned around the source/drain structure 118.

FIG. 11 depicts the product 100 after a selective etching process was performed to remove the sacrificial epi semiconductor material 116 selectively relative to the surrounding materials and particularly selectively relative to the material of the substrate 102 and the source/drain structure 118. This process operation results in the formation of an open metal silicide cavity 130 (with an opening 130A) that, in one embodiment, extends around substantially the entire outer perimeter 118P of the source/drain structure 118 for substantially the entire axial length 118L of the source/drain structure 118. Note that, in one embodiment, the metal silicide cavity 130 also extends under the source/drain structure 118, i.e., between the remaining portions of the substrate fins 103 (or the substrate 102) and the source/drain structure 118. In one illustrative example, the etching process that was performed to remove substantially all of the sacrificial epi semiconductor material 116 was a wet or gas atmosphere etching (isotropic) process. Note that, in some applications, the metal silicide cavity 130 may not expose the entirety of the perimeter 118P for the entire axial length 118L of the source/drain structure 118 or the entirety of the bottom surface 118X of the source/drain structure 118 for the entire axial length 118L of the source/drain structure 118. That is, in some cases, the etching process may only expose a portion of the perimeter 118P and/or a portion of the bottom surface 118X, and such exposure may or may not extend for the entire axial length 118L of the source/drain structure 118. In yet other cases, the etching may expose a substantial portion of the perimeter 118P and/or the bottom surface 118X for a substantial portion of the axial length 118L of the source/drain structure 118. In even other cases, the entirety of the perimeter 118P and the entirety of the bottom surface 118X of the source/drain structure 118 may both be exposed for substantially the entire axial length 118L of the source/drain structure 118. Similarly, in some applications, even when the entirety of the bottom surface 118X is exposed, there may be some residual amount of the sacrificial epi semiconductor material 116 positioned vertically between the bottom surface 118X and the remaining portions of the substrate fins 103 (substrate 102).

FIG. 12 depicts the product 100 after a metal silicide material 132 was formed in the metal silicide cavity 130 and on the exposed portions of the source/drain structures 118. The metal silicide material 132 may be formed by depositing an appropriate layer of metal, e.g., titanium, in the metal silicide cavity 130 and on the exposed portions of the source/drain structures 118 and thereafter performing one or more heating processes to form the metal silicide material 132 on the exposed portions of the source/drain structures 118. In the depicted example, wherein the open metal silicide cavity 130 extends around substantially the entire perimeter 118P of the source/drain structures 118 for substantially the entire axial length 118L of the source/drain structures 118, the metal silicide material 132 would likewise extend around substantially the entire perimeter 118P of the source/drain structures 118 for substantially the entire axial length 118L of the source/drain structures 118. However, the thickness of the metal silicide material 132 may not be entirely uniform around the entire outer perimeter 118P of the source/drain structures 118 and it may not be entirely uniform for the entire axial length 118L of the source/drain structures 118. Importantly, when viewed in a cross-section (view Y-Y) taken through the source/drain structures 118 and the metal silicide material 132 in a direction corresponding to the gate width (GW) direction of the devices, the source/drain structures 118 are now, in one illustrative embodiment, substantially surrounded by the metal silicide material 132 for substantially the entire axial length 118L of the source/drain structures 118. Note that the ends of the metal silicide material 132 abut the sidewalls 114C of the source/drain cavities 114. At minimum, the metal silicide material 132 will be positioned at least on the portions of the source/drain structures 118 exposed within the metal silicide cavity 130. In some applications, given the nature of the formation of the metal silicide cavity 130, the metal silicide material 132 will be positioned on at least a portion of the bottom surface 118X of the source/drain structures 118 and around a least a portion of the perimeter 118P of the source/drain structures 118 for at least a portion of the axial length 118L of the source/drain structures 118. In other cases, the metal silicide material 132 may be positioned on substantially the entirety of the bottom surface 118X for substantially the entire axial length 118L of the source/drain structures 118 as well as around substantially the entire perimeter 118P of the source/drain structures 118.

Figure 13:
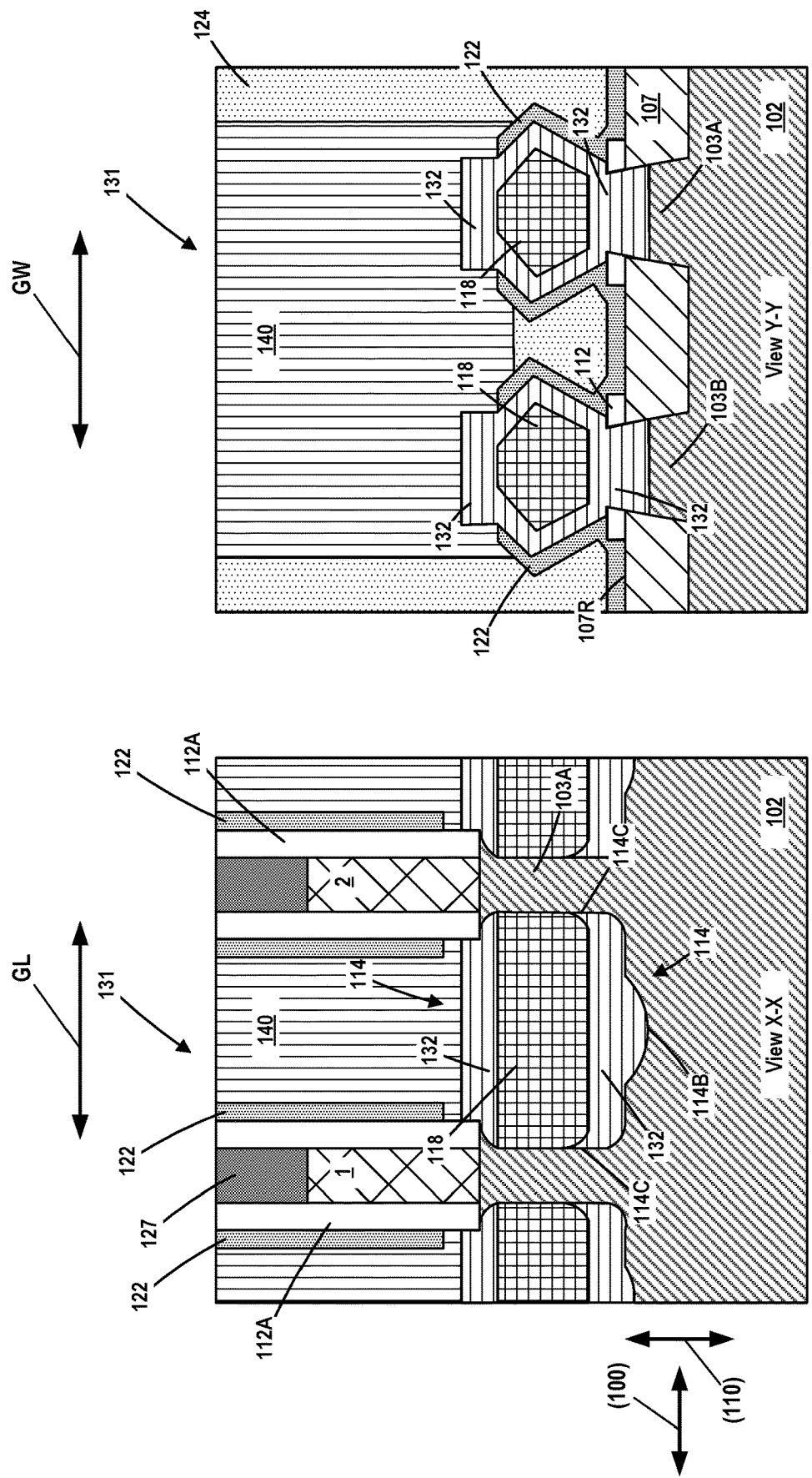

Next, as shown in FIG. 13, traditional manufacturing operations were performed to form illustrative conductive source/drain structures 140, e.g., trench silicide containing regions, in the contact openings 131 so as to conductively contact the metal silicide material 132, i.e., so as to conductively contact the source/drain regions of the device that are comprised of the source/drain structures 118. The conductive source/drain structures 140 constitute the conductive source/drain metallization structures that will eventually be conductively coupled to other contact structures (not shown) that are to be subsequently formed on the product 100. The configuration and structure of the conductive source/drain structures 140 may vary depending upon the particular application. In one example, the conductive source/drain structures 140 are line-type structures that extend in the gate width (GW) direction of the devices for substantially the entire length of the active region. In some cases, the conductive source/drain structures 140 comprise a metal material, such as tungsten (not separately shown). After the formation of the materials that make up the conductive source/drain structures 140, a chemical mechanical polishing (CMP) process was performed to remove excess materials located above the layer of insulating material 124 and the gate caps 127.

As mentioned above, with appropriate processing techniques and controls, formation of substantial amounts of the sacrificial semiconductor material 116 (and thus ultimately the metal silicide material 132) on the sidewalls 114C of the source/drain cavities 114 may be avoided or at least reduced. In the example shown in FIG. 13, by controlling the epi deposition process, the sacrificial epi material 116 is preferentially formed in the (100) direction. The physical shape of configuration of the source/drain cavities 114 may also be engineered so as to achieve desired results as it relates to the placement and location of the metal silicide material 132 relative to other structures and features of the transistor devices.

In the example shown in FIG. 13, the source/drain cavities 114 were formed such that the bottom of the source/drain cavities 114 comprises a substantially planar surface 114A and a dished recess 114B (in an approximate partial elliptical shape—when viewed in the cross-section shown taken in the gate length (GL) direction of the devices).

In the embodiment shown in FIG. 14, the source/drain cavities 114 were formed such that the bottom of the source/drain cavities 114 comprises a substantially planar surface 114A and a dished recess 114D that has a generally U-shaped configuration (when viewed in the cross-section shown taken in the gate length direction of the devices). In this embodiment, the sacrificial semiconductor material 116 was formed substantially only in the dished recess 114D.

In the embodiment shown in FIG. 15, the source/drain cavities 114 were formed such that the bottom of the source/drain cavities 114 comprises a recess 114E defined by a substantially continuous curved surface. In this example, the bottom surface of the source/drain cavities 114 has the configuration of a partial circle (when viewed in the cross-section shown taken in the gate length direction of the devices). In this embodiment, the sacrificial semiconductor material 116 was formed substantially in both the dished recess 114E and adjacent a small portion of the sidewalls 114C of the source/drain cavities 114.

Figure 16:
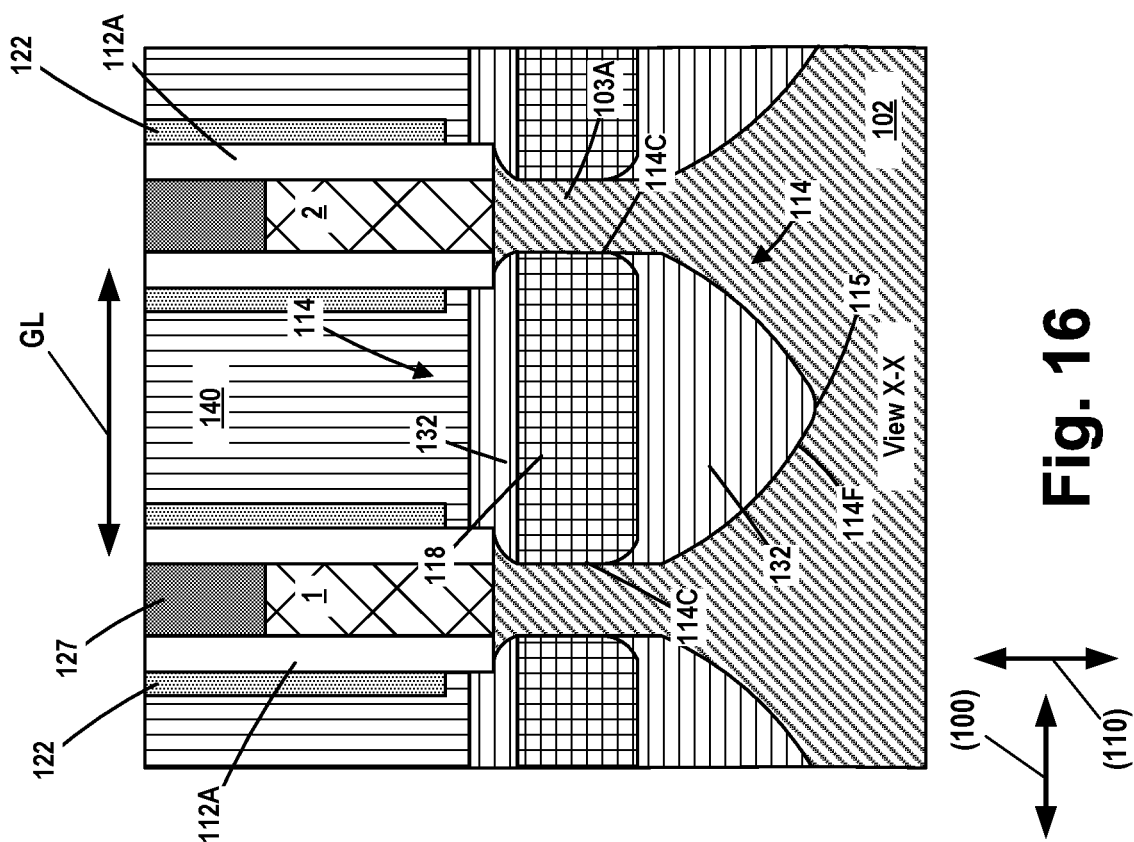

In the embodiment shown in FIG. 16, the source/drain cavities 114 were formed such that the bottom of the source/drain cavities 114 comprises a recess 114F defined by the two substantially continuous curved surfaces that extend from the sidewalls 114C and intersect at point 115. In this example, the bottom surface of the source/drain cavities 114 has the configuration of a shield (when viewed in the cross-section shown taken in the gate length direction of the devices). In this embodiment, the sacrificial semiconductor material 116 was formed substantially in both the dished recess 114F and adjacent a small portion of the sidewalls 114C of the source/drain cavities 114.

As will be appreciated by those skilled in the art after a complete reading of the present application, various novel products and methods are disclosed herein. One illustrative FinFET device disclosed herein includes a source/drain structure 118 that, when viewed in a cross-section taken through the source/drain structure in a direction corresponding to the gate width (GW) direction (view Y-Y), comprises a perimeter 118P and a bottom surface 118X and an axial length 118L that extends in a direction corresponding to the gate length (GL) direction of the device and a metal silicide material 132 positioned around at least a portion of the perimeter 118P of the source/drain structure 118 and on at least a portion of the bottom surface 118X of the source/drain structure 118 for at least a portion of the axial length 118L of the source/drain structure 118.

Another illustrative FinFET device disclosed herein includes an original substrate fin 103, a final gate structure positioned around at least a portion of the original substrate fin 103 and a source/drain structure 118 comprised of a doped epitaxial semiconductor material that abuts a first side of the original substrate fin 103, wherein the source/drain structure 118, when viewed in a cross-section taken through the source/drain structure 118 in a direction corresponding to the gate width direction of the device, comprises a perimeter 118P and a bottom surface 118X and an axial length 118L that extends in a direction corresponding to the gate length (GL) direction of the device. In this example, the device also includes a metal silicide material 132 positioned around at least a portion of the perimeter 118P of the source/drain structure 118 and on at least a portion of the bottom surface 118X of the source/drain structure for at least a portion of the axial length 118L of the source/drain structure 118.

One illustrative method disclosed herein includes performing at least one etching process to form an original substrate fin 103 in a semiconductor substrate 102, forming a gate structure around at least a portion of the original substrate fin 103, removing a portion of the original substrate fin 103 to form a source/drain cavity 114 in the original substrate fin 103 and forming a first portion of a sacrificial epitaxial semiconductor material 116, wherein the first portion of the sacrificial epitaxial semiconductor material 116 only partially fills the source/drain cavity 114. In this example, the method also includes forming a source/drain structure 118 comprised of a doped epitaxial semiconductor material on the first portion of the sacrificial epitaxial semiconductor material 116, wherein, when viewed in a cross-section taken through the source/drain structure 118 in a direction corresponding to the gate width (GW) direction of the device, the source/drain structure 118 comprises a perimeter 118P and a bottom surface 118X and an axial length 118L that extends in a direction corresponding to the gate length (GL) direction of the device, forming a second portion of the sacrificial epitaxial semiconductor material 116 on the source/drain structure 118, and forming a layer of material 122 on at least the second portion of the sacrificial epitaxial semiconductor material 116. This illustrative method also includes performing a selective etching process to remove at least part of the first and second portions of the sacrificial epitaxial semiconductor material 116 so as to thereby expose at least a portion of the perimeter 118P of the source/drain structure 118 and a least a portion of the bottom surface 118X of the source/drain structure 118 and forming a metal silicide material 132 on the exposed portion of the perimeter 118P of the source/drain structure 118 and on the exposed portion of the bottom surface 118X of the source/drain structure 118 for at least a portion of the axial length 118L of the source/drain structure 118.

In other embodiments, performing the selective etching process results in the formation of a metal silicide cavity 130 between the source/drain structure 118 and the layer of material 122, where the metal silicide cavity 130 exposes at least a portion of the perimeter 118P of the source/drain structure 118 and at least a portion of the bottom surface 118X of the source/drain structure 118, and wherein forming the metal silicide material 132 comprises forming the metal silicide material at least within the metal silicide cavity 130 and on the source/drain structure 118.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A FinFET device with a gate width direction and a gate length direction, said device comprising:
    a source/drain structure that, when viewed in a cross-section taken through said source/drain structure in a direction corresponding to said gate width direction, comprises a perimeter and a bottom surface, said source/drain structure also comprising an axial length that extends in a direction corresponding to said gate length direction; and
    a metal silicide material positioned around an entirety of said perimeter of said source/drain structure for at least a portion of said axial length of said source/drain structure and on at least a portion of said bottom surface of said source/drain structure for at least a portion of said axial length of said source/drain structure.

2. The device of claim 1, wherein said metal silicide material is positioned on an entirety of said bottom surface of said source/drain structure.

3. The device of claim 2, wherein said metal silicide material comprises a bottom portion positioned under said bottom surface of said source/drain structure, wherein at least part of said bottom portion of said metal silicide material has, when viewed in a cross-section taken through said source/drain structure in a direction corresponding to said gate length direction, one of a U-shape, a semi-circular shape, a partial elliptical shape portion or a shield shape cross-sectional configuration.

4. The device of claim 1, wherein said source/drain structure comprises a doped epitaxial semiconductor material.

5. The device of claim 4, wherein said source/drain structure abuts a first side of an original substrate fin and wherein said device further comprises a gate structure positioned around at least a portion of said original substrate fin.

6. The device of claim 1, further comprising a conductive source/drain structure that conductively contacts at least a portion of said metal silicide material.

7. A FinFET device with a gate width direction and a gate length direction, said device comprising:
    an original substrate fin;
    a gate structure positioned around at least a portion of said substrate original substrate fin;
    a source/drain structure comprised of a doped epitaxial semiconductor material, said source/drain structure abutting a first side of said original substrate fin, said source/drain structure, when viewed in a cross-section taken through said source/drain structure in a direction corresponding to said gate width direction, comprises a perimeter and a bottom surface, said source/drain structure also comprising an axial length that extends in a direction corresponding to said gate length direction; and
    a metal silicide material positioned around an entirety of said perimeter of said source/drain structure for at least a portion of said axial length of said source/drain structure and on at least a portion of said bottom surface of said source/drain structure for at least a portion of said axial length of said source/drain structure.

8. The device of claim 7, wherein said metal silicide material is positioned on an entirety of said bottom surface of said source/drain structure.

9. The device of claim 7, wherein said metal silicide material extends along substantially an entirety of said axial length of said source/drain structure.

10. The device of claim 8, wherein said metal silicide material extends along substantially an entirety of said axial length of said source/drain structure.

11. The device of claim 8, wherein said metal silicide material comprises a bottom portion positioned under said bottom surface of said source/drain structure, wherein at least part of said bottom portion of said metal silicide material has, when viewed in a cross-section taken through said source/drain structure in a direction corresponding to said gate length direction, one of a U-shape, a semi-circular shape, a partial elliptical shape portion or a shield shape cross-sectional configuration.

12. A FinFET device with a gate width direction and a gate length direction, said device comprising:
    a source/drain structure that, when viewed in a cross-section taken through said source/drain structure in a direction corresponding to said gate width direction, comprises a perimeter and a bottom surface, said source/drain structure also comprising an axial length that extends in a direction corresponding to said gate length direction; and
    a metal silicide material positioned on at least a portion of said perimeter of said source/drain structure for at least a portion of said axial length of said source/drain structure and on an entirety of said bottom surface of said source/drain structure for at least a portion of said axial length of said source/drain structure.

13. The device of claim 1, wherein said metal silicide material extends along substantially an entirety of said axial length of said source/drain structure.

14. The device of claim 12, wherein said metal silicide material extends along substantially an entirety of said axial length of said source/drain structure.

15. The device of claim 14, wherein said metal silicide material extends around an entirety of said perimeter of said source/drain structure.

16. The device of claim 15, wherein said source/drain structure comprises a doped epitaxial semiconductor material.

* * * * *